(12) United States Patent
Gibson et al.

(10) Patent No.: US 10,049,738 B2
(45) Date of Patent: Aug. 14, 2018

(54) TEMPERATURE GRADIENTS FOR CONTROLLING MEMRISTOR SWITCHING

(71) Applicant: Hewlett Packard Enterprise Development LP, Houston, TX (US)

(72) Inventors: Gary Gibson, Palo Alto, CA (US); R. Stanley Williams, Portola Valley, CA (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 15/536,602

(22) PCT Filed: Dec. 17, 2014

(86) PCT No.: PCT/US2014/070744
§ 371 (c)(1),
(2) Date: Jul. 17, 2017

(87) PCT Pub. No.: WO2016/099472
PCT Pub. Date: Jun. 23, 2016

(65) Prior Publication Data
US 2017/0372782 A1    Dec. 28, 2017

(51) Int. Cl.
*G11C 11/00* (2006.01)
*G11C 13/00* (2006.01)
*H01L 45/00* (2006.01)

(52) U.S. Cl.
CPC ...... *G11C 13/0069* (2013.01); *G11C 13/0007* (2013.01); *H01L 45/08* (2013.01); *H01L 45/128* (2013.01); *H01L 45/1233* (2013.01); *H01L 45/146* (2013.01); *G11C 2013/008* (2013.01); *G11C 2213/15* (2013.01); *G11C 2213/52* (2013.01)

(58) Field of Classification Search
CPC ........... G11C 13/0007; G11C 13/0069; G11C 2213/77; G11C 2213/52; G11C 13/0002; G11C 13/0004; G11C 11/5685; G11C 13/0011; G11C 2013/0073; G11C 2013/008; G11C 2213/15; G11C 2213/50
USPC ....... 365/148, 163, 151, 100, 113, 145, 149, 365/153, 157, 158, 189.011, 189.16
See application file for complete search history.

(56) References Cited

U.S. PATENT DOCUMENTS

| | | | |
|---|---|---|---|
| 7,327,602 B2 | 2/2008 | Kostylev et al. | |
| 8,062,921 B2 | 11/2011 | Wicker et al. | |
| 8,098,517 B2 | 1/2012 | Kostylev | |
| 2007/0159868 A1 | 7/2007 | Sugita et al. | |
| 2008/0265240 A1 | 10/2008 | Lan et al. | |

(Continued)

OTHER PUBLICATIONS

International Searching Authority, The International Search Report and the Written Opinion, dated Aug. 31, 2015, PCT/US2014/070744, 13 Pages.

(Continued)

*Primary Examiner* — Thong Q Le
(74) *Attorney, Agent, or Firm* — Hewlett Packard Enterprise Patent Department

(57) ABSTRACT

A memristor includes a bottom electrode, a top electrode, and an active region disposed therebetween. The active region has an electrically conducting filament in an electrically insulating medium, extending between the bottom electrode and the top electrode. The memristor further includes a temperature gradient element for controlling switching.

11 Claims, 3 Drawing Sheets

(56) References Cited

U.S. PATENT DOCUMENTS

| | | |
|---|---|---|
| 2008/0278988 A1 | 11/2008 | Efert |
| 2010/0172170 A1 | 7/2010 | Tamai et al. |
| 2012/0327708 A1 | 12/2012 | Du et al. |
| 2013/0087755 A1* | 4/2013 | Prodromakis .......... H01L 45/08 438/382 |
| 2014/0103282 A1 | 4/2014 | Wang et al. |
| 2014/0112059 A1 | 4/2014 | Miao et al. |
| 2014/0169062 A1 | 6/2014 | Lee et al. |

OTHER PUBLICATIONS

Strukov, Dmitri B., et al., Thermophoresis / Diffusion as a Plausible Mechanism for Unipolar Resistive Switching in Metal-Oxide-Metal Memristors, Mar. 21, 2012, Applied Physics A, Materials Science & Processing, 12 pages.

* cited by examiner

TEMPERATURE GRADIENTS FOR CONTROLLING MEMRISTOR SWITCHING

BACKGROUND

Memristors are devices that can be programmed to different resistive states by applying a programming energy, such as a voltage. After programming, the state of the memristor can be read and remains stable over a specified time period. Thus, memristors can be used to store digital data. For example, a high resistance state can represent a digital "0" and a low resistance state can represent a digital "1" (or vice versa). Large crossbar arrays of memristive elements can be used in a variety of applications, including random access memory, non-volatile solid state memory, programmable logic, signal processing control systems, pattern recognition, and other applications.

DETAILED DESCRIPTION

Figure 1A:
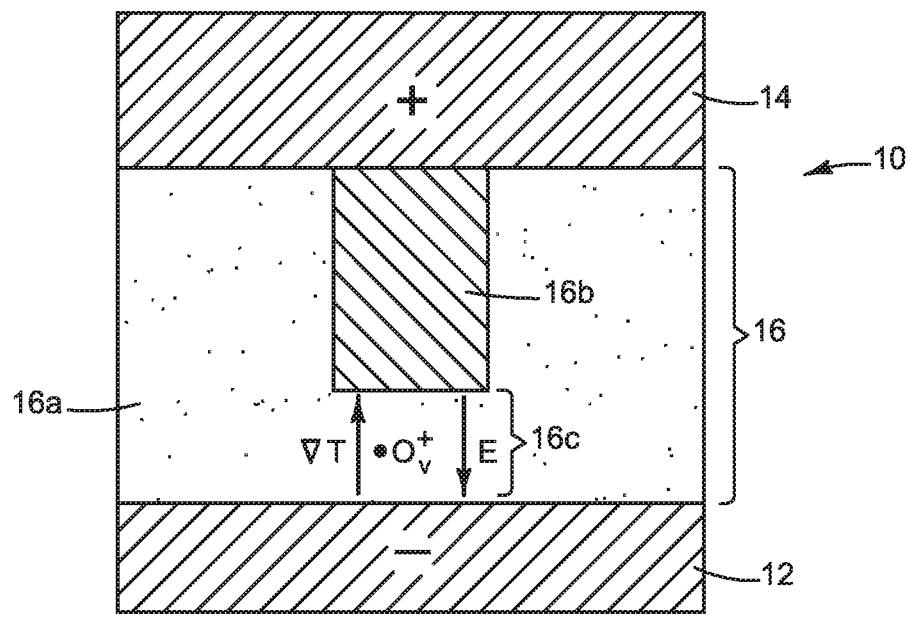
FIGS. 1A-1B depict a set process (FIG. 1A) and a reset process (FIG. 1B) for a memristor having an axial thermal gradient, according to an example.

It is to be appreciated that, in the following description, numerous specific details are set forth to provide a thorough understanding of the examples. However, it is appreciated that the examples may be practiced without limitation to these specific details. In other instances, well-known methods and structures may not be described in detail to avoid unnecessarily obscuring the description of the examples. Also, the examples may be used in combination with each other.

While a limited number of examples have been disclosed, it should be understood that there are numerous modifications and variations therefrom. Similar or equal elements in the Figures may be indicated using the same numeral.

It is be noted that, as used in this specification and the appended claims, the singular forms "a," "an," and "the" include plural referents unless the context clearly dictates otherwise.

Memristors are nano-scale devices that may be used as a component in a wide range of electronic circuits, such as memories, switches, radio frequency circuits, and logic circuits and systems. In a memory structure, a crossbar array of memristor devices may be used. When used as a basis for memories, memristors may be used to store bits of information, 1 or 0. When used as a logic circuit, a memristor may be employed as configuration bits and switches in a logic circuit that resembles a Field Programmable Gate Array, or may be the basis for a wired-logic Programmable Logic Array. It is also possible to use memristors capable of multi-state or analog behavior for these and other applications.

The resistance of a memristor may be changed by applying a voltage across or a current through the memristor. Generally, at least one channel may be formed that is capable of being switched between two states—one in which the channel forms an electrically conductive path ("ON") and one in which the channel forms a less conductive path ("OFF"). In some cases, conducting channels may be formed by ions and/or vacancies. Some memristors exhibit bipolar switching, where applying a voltage of one polarity may switch the state of the memristor and where applying a voltage of the opposite polarity may switch back to the original state. Alternatively, memristors may exhibit unipolar switching, where switching is performed, for example, by applying different voltages of the same polarity.

Examples disclosed herein provide for thermally-insulated memristor devices. In example implementations, a memristor device includes a memristor coupled in electrical series between at least two electrodes and a thermally-insulating cladding surrounding a portion of the memristor. In this connection, the electrodes used may also be more thermally insulating than in more conventional devices. NbN is more thermally insulating than the commonly used TiN while still providing adequate electrical conductivity. Multilayer electrodes such as alternating layers of TiN and TaN can also provide good thermal insulation and appropriate electrical conductivity. Insulating the memristor may raise its temperature when a voltage or current is applied—such as during writing—due to Joule heating. Joule heating, also known as resistive heating, may occur when heat is generated in a material as the result of a current passing through the material. Typically, a larger voltage creates a larger current through the material, which causes a larger amount of heat to be released by the material.

In this manner, the example memristor devices disclosed herein may exhibit accelerated switching. In some cases, switching of a memristor may be influenced by the temperature of the memristor. Without adhering to any particular theory, processes which drive ionic and electronic motion—including drift, thermophoresis, and diffusion—may accelerate with increasing temperature. Thus, raising the temperature of the memristor may influence switching speed of the memristor device, which, among other features, may allow for reducing the amount of time required for application of a programming bias via a voltage or current or enable the use of lower voltages and currents over the same time period. Accordingly, increasing the switching speed may mitigate errors and improve operation efficiency.

The present teachings address two issues. First, memristor OFF-switching (reset) is typically a slower process than ON-switching (set). Second, it is sometimes difficult to limit the ON-switching process and, as a result, memristor elements can get permanently stuck in too conductive a state.

In accordance with the teachings herein, controlling thermal gradients in a memristor cell may be used to increase the speed with which the state of a memristor cell can be reset relative to set, as well as limit the conductance of the set state. Thus, controlling the switching processes in memristor memory cells may be achieved by creating beneficial temperature gradients during cell switching operations. By "controlled switching" is meant speeding or limiting the setting or resetting of the device's resistance state.

A memristor may include a bottom electrode, a top electrode, and an active region disposed between the two electrodes. The active region may have an electrically conducting filament in an electrically insulating medium extending between the bottom electrode and the top electrode. The memristor may further include a temperature gradient element for controlling switching.

As a result, reset times may be reduced, bringing them more into line with set times. Overdriving of the set process may be minimized, which may prevent memory cells from becoming stuck in the ON state and thereby may increase endurance.

This disclosure concerns memristor memory devices where the state of the device is determined by the distribution of oxygen vacancies. In general, temperature gradients could be used to control the switching in any memory device where the switching process is impacted by a temperature gradient.

Three of the forces that are important in moving the vacancies during set or reset operations are drift, diffusion, and thermophoresis. Thermophoresis is a force felt by vacancies in a temperature gradient. It tends to force them toward higher temperature regions. Normal operation of memristor cells results in significant Joule heating. By tailoring the thermal properties and shapes of the structures that form the memory cell, temperature gradients can be created during the reset process that speed the motion of vacancies in the desired direction. Similarly, the temperature gradients that occur during a set operation can be engineered to create forces that limit the extent of the motion of the vacancies, thereby preventing the memory cell from being driven into a state that is too conductive and from which it is difficult to reset to a high resistance state.

The motion of vacancies during set/reset operations can be axial (i.e. along a direction perpendicular to the plane of the electrodes and switching layer) or radial (in the plane of the switching layer and perpendicular to a conducting filament), or a combination of both. As an example, consider the axial case, which is believed to dominate in $TiO_x$-based memristors. Here a conductive filament composed of oxygen vacancies may be driven most of the way across the switching layer (from one electrode—the "source" electrode—to the opposite electrode—the "target" electrode) to put the cell into a low resistance state. To reset the cell to a high resistance state, the oxygen vacancies are driven in the opposite direction and the gap between the conducting filament and opposite electrode is widened. By choosing electrode materials with appropriate thermal properties relative to each other and to the switching layer and filament, the axial temperature gradient in the region of the gap can be made large during the switching processes, with the conducting filament and/or the source electrode much hotter than the electrode that the filament is not connected to. In most cases, the thermalization time of this system will be fast compared to the switching time so that the thermal conductivity of the local materials is the most important parameter in engineering a large temperature gradient during the switching process. Otherwise, choosing materials with appropriate heat capacity can also be important.

One could, for example, choose the non-connected electrode material (the target electrode) to be one that is thermally anchored, by which is meant that it is strongly thermally connected to a larger structure (a structure with a large thermal mass) that maintains a relatively low temperature (the target electrode itself could have a large thermal mass). It then stays relatively cool even when the end of the filament is relatively close to it, while the other electrode (the source electrode) is chosen to have a relatively low thermal conductivity so that it is poorly thermally anchored to the ambient environment, and may also have a low thermal mass. Consequently, the source electrode may be hotter than the target electrode during the switching process due to heat evolved between the electrodes. Thus, portions of the conducting filament may experience axial temperature gradients that drive oxygen vacancies toward the hotter source electrode. This may speed the reset process when switching back to a high resistance state. It can also limit how small the gap becomes during a set operation, and therefore limits the set resistance, because the temperature gradient near the tip of the filament 16b can become larger as the tip approaches the target electrode. This can occur, for example, if the switching is accomplished with a voltage-controlled pulse so that the power dissipated through Joule heating increases as the gap between the filament decreases and, therefore, the resistance decreases. The greater heat released with smaller gaps leads to higher thermal gradients.

Similar techniques can be used for switching materials where radial motion of oxygen vacancies is important. For example, a well thermally-anchored structure can be created around the perimeter of the memristor channel, thereby creating a radial thermal gradient during switching operations that tends to drive oxygen vacancies toward the center of the channel.

The entirety of this surrounding structure need not necessarily be electrically insulating. It could include a thin electrically insulating layer surrounded by something electrically conducting. Alternatively, it could consist entirely of electrically conducting materials that are not electrically connected to anything else (floating). Electrically insulating materials often have low thermal conductivities, although there are certainly exceptions that could be utilized here. $Al_2O_3$, for example, has a thermal conductivity that is higher than $TiO_2$.

The advantages of the devices disclosed herein include increased reset speed and self-limiting of set process. This approach may also allow one to decrease the bias needed to reset the state of a memristor cell at a desired speed, which would decrease the power required for operation. In cases where the reset bias is currently higher than the bias required for set, this would also minimize the cost of the circuits required to apply the switching biases. Furthermore, lower voltage circuits are smaller and can enable higher bit densities.

FIGS. 1A-1B and FIGS. 2A-2B depict two different situations regarding employing a thermal gradient to change the state of a memristor. In one case (FIGS. 1A-1B), the thermal gradient in memristor 10 is primarily axial (updown, or vertically, on the sheet), while in the other case (FIGS. 2A-2B), the thermal gradient in memristor 10' is primarily radial (side-to-side, or horizontally, on the sheet). In this connection, it may be appreciated that FIGS. 1A-1B and FIGS. 2A-2B each represent a limiting case in the sense that the former depicts a purely axial situation and the latter depicts a purely radial situation. In reality, some of both may occur.

In all cases, the memristor 10, 10' has a bottom electrode 12, a top electrode 14, and an active region 16 sandwiched between the two electrodes. The active region 16 is a relatively insulating region 16a in which a relatively conducting filament 16b is formed. As the conducting filament 16b extends from one electrode 12 to the other (here, from the top electrode 14 to the bottom electrode 12), a gap 16c between the filament 16b and the bottom electrode 12 is reduced and the device 10, 10' becomes more conducting and assumes an "ON" state.

As the conducting filament 16b retreats from the other electrode here, from the bottom electrode 12), the gap 16c is increased and the device 10, 10' becomes more resistive, and assumes an "OFF" state. An "ON" state may be associated with a more conductive (less resistive) device 10, 10', with an "OFF" state associated with a less conductive (more resistive) device. The ON state is usually associated with a value "1", while the OFF state is usually associated with a value "0". However, in some examples, this convention may be reversed, with an "ON" state associated with a value "0" and an OFF state associated with a value "1".

FIG. 1A depicts a set process in the case where motion of oxygen vacancies ($O_V^+$) is primarily axial (vertical in the Figure). The conducting filament 16b has a region with a high concentration of oxygen vacancies and is electrically connected more strongly to the top electrode 14 than to the bottom electrode 12. During the set process, heat is evolved in the filament 16b through Joule heating. Heat may also be evolved due to Joule heating in the gap 16c between the filament 16b and the bottom electrode 12, depending upon the electrical conduction mechanism (e.g., for Poole-Frenkel conduction). If the electrical conduction involves tunneling of electrons from the bottom electrode 12 to the bottom of the filament 16b, heating may also occur near the end of the filament due to thermalization of the tunneling electrons. The top electrode 14 may be a relatively low thermal conductivity material (at least in the region near the filament 16b) and the bottom electrode 12 may be a relatively higher thermal conductivity material (well-thermally anchored). The temperature gradient $\nabla T$ is as shown in FIG. 1 and drives oxygen vacancies toward the filament 16b (up in the Figure). The electric field E drives positively charged vacancies "down" to extend the filament 16b and decrease the device 10 resistance (set process). As the filament 16b approaches the bottom electrode 12, this process is retarded due to the countervailing force on the oxygen vacancies due to the thermal gradient $\nabla T$, thereby limiting the set process and preventing the device 10 from being "stuck on".

Figure 1B:
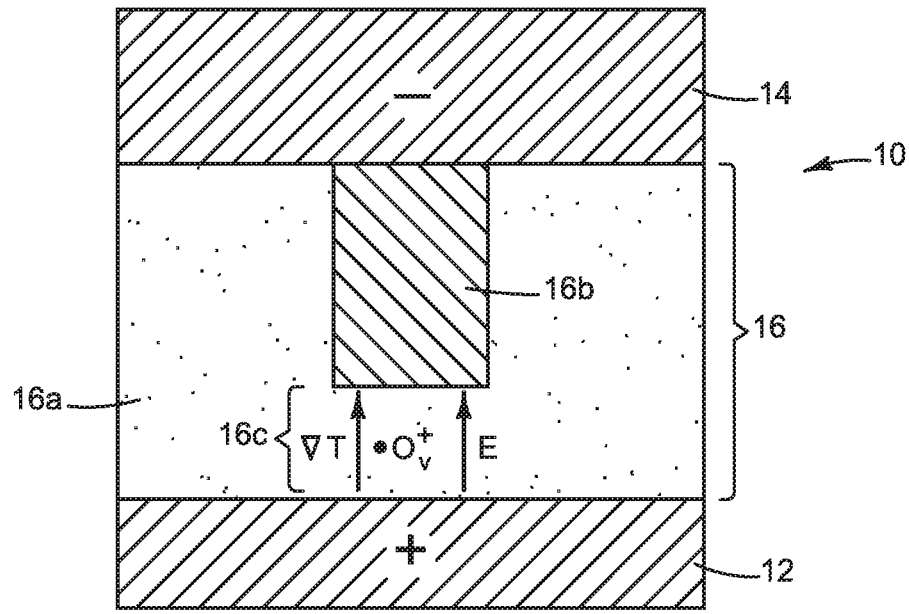

FIG. 1B depicts a reset process in the case where the motion of the oxygen vacancies is primarily axial (vertical in the Figure). The conducting filament 16b has a region with a high concentration of oxygen vacancies ($O_V^+$) and is electrically connected more strongly to the top electrode 14 than to the bottom electrode 12. During the reset process, heat is evolved in the filament 16b through Joule heating. Heat may also be evolved due to Joule heating in the gap 16c between the filament 16b and the bottom electrode 12, depending upon the electrical conduction mechanism (e.g. for Poole-Frenkel conduction). The top electrode 14 may be a relatively low thermal conductivity material (at least in the region near the filament) and the bottom electrode 12 may be a relatively higher thermal conductivity material (well-thermally anchored). The electric field E drives positively charged vacancies "up" to increase the gap 16c and thereby increase the device resistance (reset process). The temperature gradient $\nabla T$ is as shown and also drives oxygen vacancies toward the filament 16b (up in FIG. 2). This results in a faster reset process.

Examples of electrode 12, 14 materials suitably employed in the practice of the teachings herein may have thermal conductivities in the range of a few tenths (and below) of Watts/meter/Kelvins ($W \cdot m^{-1} \cdot K^{-1}$) to single digit and tens of $W \cdot m^{-1} \cdot K^{-1}$ to hundreds of $W \cdot m^{-1} \cdot K^{-1}$. The relative thermal conductivity may be important, and thus it is the ratio of the two values that may be considered. In some examples, the ratio of the two values may be 2 or more. Examples of lower thermal conductivity electrode materials may include TaN (1.7 to 5 $W \cdot m^{-1} \cdot K^{-1}$) and NbN (3 to 5 W/m/K). Examples of higher thermal conductivity electrode materials may include TiN (10 to 20 $W \cdot m^{-1} \cdot K^{-1}$), Pt (70 $W \cdot m^{-1} \cdot K^{-1}$), W (173 $W \cdot m^{-1} \cdot K^{-1}$), and Cu (353 to 401 $W \cdot m^{-1} \cdot K^{-1}$). Various combinations of materials having different thermal conductivities may be employed, so long as there is a sufficient difference between them (a ratio of at least 2).

If one were to reverse the direction of the thermal gradient in FIG. 1B, but keep the direction of the electric field the same, then one could retard the reset process. The thermal gradient $\nabla T$, represented by the arrow, would be in the downward direction, toward the bottom electrode 12 (instead of the upward direction, as shown in FIG. 1B). This would tend to push the oxygen vacancies ($O_V^+$) down, which would be at least partially resist the upward force on the oxygen vacancies provided by the electric field that is created by positively biasing the bottom electrode relative to the top electrode. This would have the effect of retarding, or slowing down, the reset process. A reversed thermal gradient could be created if the top electrode 14 and/or filament 16b were well thermally anchored compared to the bottom electrode 12. Note that significant heating can occur from electrons dumping energy into the bottom electrode 12 that tunnel across the gap 16c. This process would be accentuated by thermally anchoring the top electrode 14, as described above.

Figure 2A:
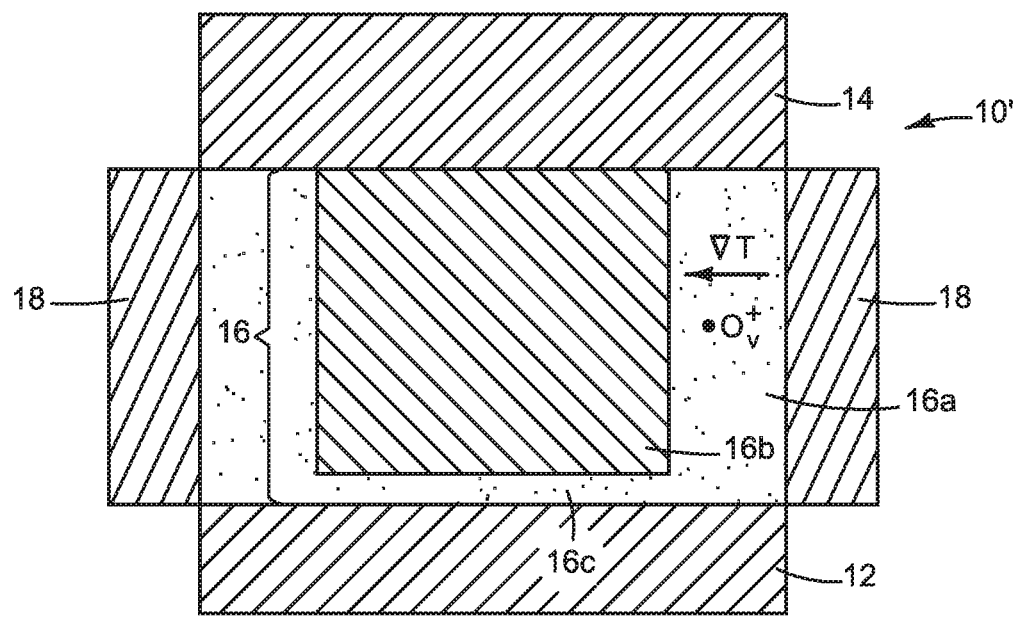
FIGS. 2A-2B depict a set process (FIG. 2A) and a reset process (FIG. 2B) for a memristor having a radial thermal gradient, according to an example.

FIG. 2A depicts a set process in the case where the motion of oxygen vacancies includes a radial component (horizontal in the Figure) in device 10'. The conducting filament 16b has a region with a high concentration of oxygen vacancies ($O_V^+$). The conductivity of this filament 16b can be increased by adding oxygen vacancies to it During the set process, heat is evolved in the filament 16b through Joule heating. The top electrode 14 and bottom electrode 12 are each of a relatively low thermal conductivity material (at least in the region near the filament 16b) and are not well thermally grounded to rest of world. The filament 16 is at least partially surrounded by structures 18 that have a relatively high thermal conductivity and are well thermally grounded to the rest of the world. The temperature gradient $\nabla T$ is as shown and drives oxygen vacancies toward the filament 16b. This results in a faster set process.

Figure 2B:
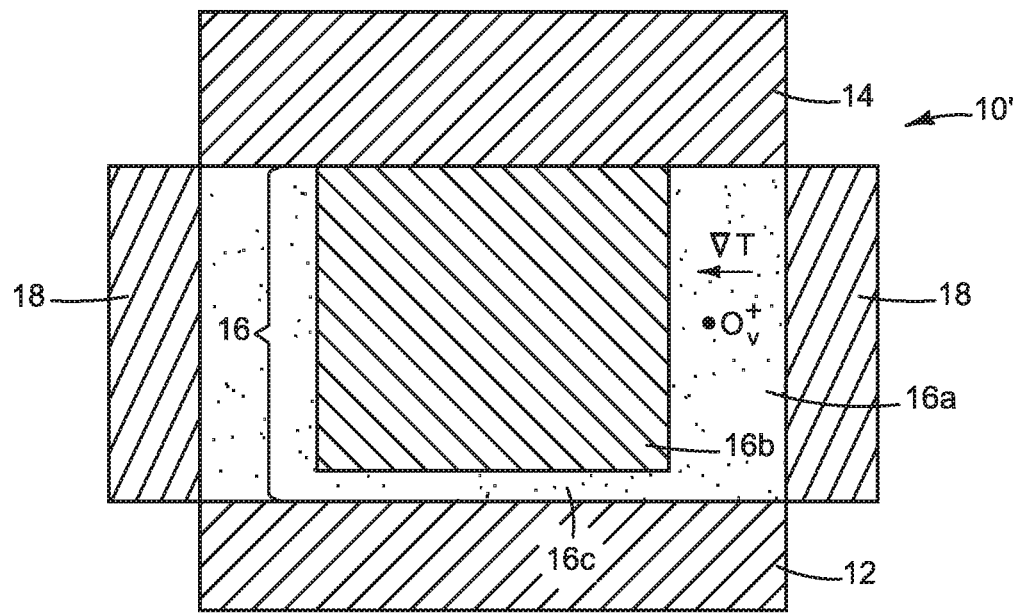

FIG. 2B depicts a reset process in the case where the motion of oxygen vacancies includes a radial component (horizontal in the Figure) in device 10'. However, in this case, the thermal conductivities are reversed. That is to say, the bottom electrode 12 and top electrode 14 are of a relatively high thermal conductivity (at least in the region near the filament 16b), and well thermally anchored, and the structures 18 are of a relatively low thermal conductivity. The heat may be evolved in or near the filament 16b, so a structure 18 around the perimeter will always be cooler (unless it is heated directly). However, the magnitude of the radial thermal gradient could be changed by thermally isolating the perimeter structure 18 rather than thermally anchoring it. Essentially, this would change the ratio of the axial temperature gradient to the radial temperature gradient (more heat would flow to the electrodes rather than the perimeter structure 18).

The conducting filament 16b has a region with a high concentration of oxygen vacancies ($O_V^+$). The conductivity of this filament 16b can be increased by adding oxygen vacancies to it During the reset process, heat is evolved in the filament 16b through Joule heating. The top electrode 14 and bottom electrode 12 are of a relatively high thermal conductivity material (at least in the region near the filament 16b) and are well thermally grounded to the rest of the world. The filament 16b is at least partially surrounded by structures 18 that are not well thermally grounded to the rest of the world. The temperature gradient VT is as shown and drives oxygen vacancies toward the filament 16b, but not as strongly as in the case described in FIG. 2A. This limits the extent of the reset process, preventing it from being driven too far. This configuration provides a faster reset and prevention of over set.

How any of these approaches might be used in practice would depend on which issues tend to be more problematic and which structure was more effective in mitigating the corresponding issue. The latter depends on the nature of the conducting filament, where the heat is evolved, and how important thermophoresis is in driving set or reset. It is expected that one might construct a "trial" memristor structure, test it, and then make suitable alterations, following one of the approaches described above.

Figure 3:
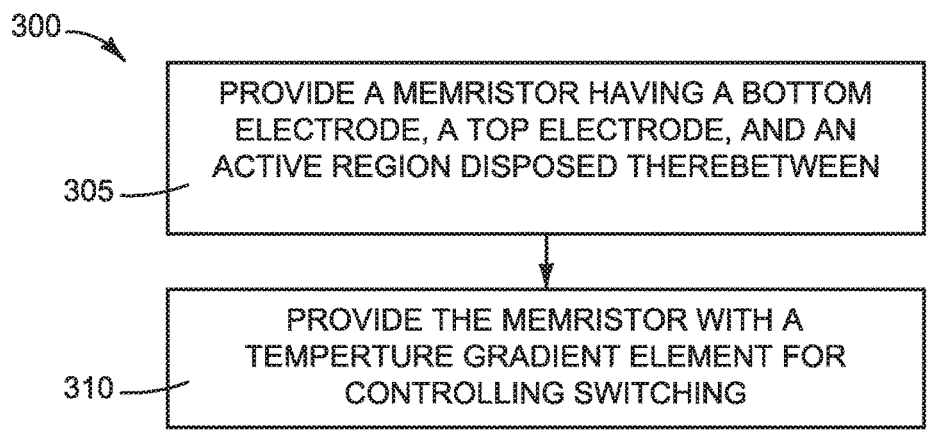
FIG. 3 depicts a method for changing a state of a memristor using a thermal gradient, according to an example.

FIG. 3 depicts a method for controlling switching in a memristor by means of a thermal gradient. The method includes providing 305 the memristor. As described above, the memristor 10, 10' includes a bottom electrode 12, a top electrode 14, and an active region 16 disposed therebetween. The active region 16 may have an electrically conducting filament 16b in an electrically insulating material 16a extending or partially extending between the bottom electrode 12 and the top electrode 14. The memristor 10, 10' further may include a temperature gradient element for controlling switching.

The method 300 continues by providing 310 the memristor with a temperature gradient element for controlling switching. As described above, heat is evolved in or near the filament 16b (e.g., in the gap) to generate a thermal gradient between the filament and the temperature gradient element. In this connection, it should be noted that there can be vacancies in the gap 16c, just not enough to make it as electrically conducting as the portions of the filament 16b that have a higher vacancy density. This distinction may matter because motion of these vacancies can also contribute to changing the resistive state of the memristor (by adding/subtracting from the filament 16b and/or changing the conductance of the gap 16c). In the case of FIGS. 1A-1B, heat evolved in the gap will flow primarily toward the target electrode, thereby contributing to the gradient in the gap 16c and driving vacancies in the gap "up". Any heat evolved in the gap 16c will not add to the gradient above the location where it is evolved (it can only decrease it due to the small fraction of heat that flows "up").

In the case of an axial thermal gradient, the temperature gradient element may be the high thermal conductivity electrode, here, bottom electrode 12. In other examples, the top electrode 14 may be the high thermal conductivity electrode.

In the case of radial thermal gradient, the temperature gradient element may be the high thermal conductivity structure(s) 18 surrounding the active region 16.

Figure 4:
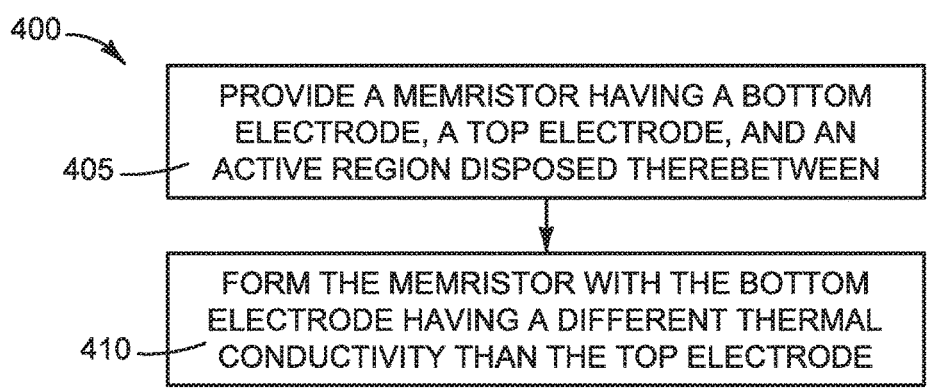
FIG. 4 depicts a method for manufacturing a memristor having a temperature gradient element for providing a thermal gradient, according to an example.

FIG. 4 depicts a method 400 of manufacturing a memristor that includes a temperature gradient element for controlling switching. The method 400 includes providing 405 the memristor. As described above, the memristor includes a bottom electrode 12, a top electrode 14, and an active region 16 disposed therebetween.

The method 400 concludes by forming 410 the memristor with the bottom electrode having a different thermal conductivity or a different degree of thermal anchoring than the top electrode.

Figure 5:
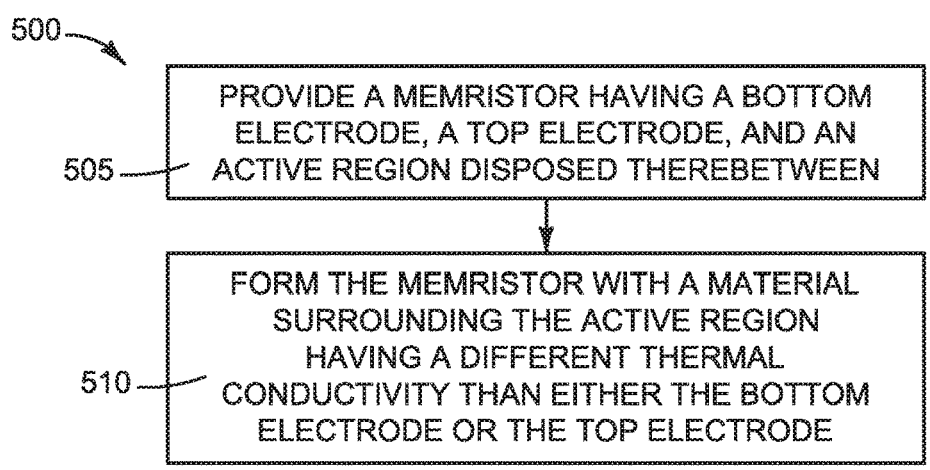
FIG. 5 depicts an alternate method for manufacturing a memristor having a temperature gradient element for providing a thermal gradient, according to an example.

FIG. 5 depicts another method 500 of manufacturing a memristor that includes a temperature gradient element for controlling switching. The method 500 includes providing 505 the memristor. As described above, the memristor includes a bottom electrode 12, a top electrode 14, and an active region 16 disposed therebetween.

The method 500 concludes by forming 510 the memristor with a material surrounding the active region having a different thermal conductivity than either the bottom electrode or the top electrode.

Advantageously, the reset speed is increased and there is self-limiting of the set process. This approach may also allow one to decrease the bias needed to reset the state of a memristor cell at a desired speed, which would decrease the power required for operation. In cases where the reset bias is currently higher than the bias required for set, this would also minimize the cost of the circuits required to apply the switching biases. Furthermore, lower voltage circuits are smaller and can enable higher bit densities.

What is claimed is:

1. A memristor including a bottom electrode, a top electrode, and an active region disposed therebetween, the active region having an electrically conducting filament in an electrically insulating medium extending between the bottom electrode and the top electrode, the memristor further including a temperature gradient element for controlling switching,
   wherein the temperature gradient element is thermally anchored relative to that of the bottom electrode or top electrode or both that generates a thermal gradient sufficient to drive dopant species in a predetermined direction; and
   wherein the temperature gradient element is one of the top electrode and the bottom electrode and has a different thermal anchoring relative to that of the other of the bottom electrode and the top electrode, thereby creating an axial temperature gradient.

2. The memristor of claim 1, in which a ratio of thermal conductivity of one electrode to thermal conductivity of the other electrode is at least two.

3. The memristor of claim 1, in which the temperature gradient element comprises a material surrounding the active region and has a different thermal anchoring relative to that of the bottom electrode or the top electrode, thereby impacting the radial temperature gradient.

4. The memristor of claim 3, in which a ratio of thermal conductivity of the temperature gradient element and the thermal conductivity of the bottom electrode or the top electrode is at least a factor of two.

5. A method of controlling switching in a memristor, the method including:
   providing a memristor having a bottom electrode, a top electrode, and an active region disposed therebetween, the active region having an electrically conducting filament in an electrically insulating extending between the bottom electrode and the top electrode, and
   providing the memristor with a temperature gradient element for controlling switching, wherein the temperature gradient element has a thermal anchoring relative to that of the bottom electrode or top electrode or both that generates a thermal gradient sufficient to drive dopant species in a predetermined direction; and
   wherein the thermal conductivity difference between the temperature gradient element and the top electrode or bottom electrode or is at least a factor of two.

6. The method of claim 5, in which the temperature gradient element is one of the top electrode and the bottom electrode and has a different thermal conductivity relative to that of the other of the bottom electrode and the top electrode, thereby creating an axial temperature gradient.

7. The method of claim 5, in which the temperature gradient element comprises a material surrounding the active region and has a different thermal conductivity relative to that of the bottom electrode or the top electrode, thereby altering a radial gradient.

8. A method of manufacturing a memristor that includes a temperature gradient element for controlling switching, the memristor further including a bottom electrode, a top electrode, and an active region disposed therebetween, the method comprising:
either forming the memristor with the bottom electrode having a different thermal conductivity than the top electrode, or
forming the memristor with a material surrounding the active region having a different thermal conductivity than either the bottom electrode or the top electrode.

9. The method of claim 8, in which the temperature gradient element has a thermal conductivity relative to that of the bottom electrode or top electrode or both that generates a thermal gradient sufficient to drive dopant species in a predetermined direction, and in which the thermal conductivity difference between the temperature gradient element and the top electrode or bottom electrode or is at least a factor of two.

10. The method of claim 9, in which one of the top electrode and the bottom electrode has a high thermal conductivity relative to the other of the bottom electrode and the top electrode, thereby creating an axial temperature gradient.

11. The method of claim 9, in which the material surrounding the active region has a high thermal conductivity material relative to the active region, thereby creating a radial temperature gradient.

* * * * *